(12) United States Patent
Cao et al.

(10) Patent No.: US 9,416,437 B2
(45) Date of Patent: Aug. 16, 2016

(54) EVAPORATING DEVICE AND VACCUM EVAPORATION DEVICE USING THE SAME

(71) Applicants: SHENZHEN FUTAIHONG PRECISION INDUSTRY CO., LTD., Shenzhen (CN); FIH (Hong Kong) Limited, Kowloon (HK)

(72) Inventors: Da-Hua Cao, Shenzhen (CN); Bin Li, Shenzhen (CN)

(73) Assignees: SHENZHEN FUTAIHONG PRECISION INDUSTRY CO., LTD., Shenzhen (CN); FIH (Hong Kong) Limited, Kowloon (HK)

( * ) Notice: Subject to any disclaimer, the term of this patent is extended or adjusted under 35 U.S.C. 154(b) by 618 days.

(21) Appl. No.: 13/939,535

(22) Filed: Jul. 11, 2013

(65) Prior Publication Data

US 2014/0076235 A1 Mar. 20, 2014

(30) Foreign Application Priority Data

Sep. 14, 2012 (CN) .......................... 2012 1 03398473

(51) Int. Cl.
| | | |
|---|---|---|
| C23C 16/00 | (2006.01) | |
| C23C 14/22 | (2006.01) | |
| C23C 16/448 | (2006.01) | |
| C23C 14/00 | (2006.01) | |
| C23C 14/24 | (2006.01) | |

(52) U.S. Cl.
CPC ........... *C23C 14/228* (2013.01); *C23C 14/0021* (2013.01); *C23C 14/243* (2013.01); *C23C 16/448* (2013.01); *C23C 16/4481* (2013.01)

(58) Field of Classification Search
CPC .. C23C 16/448; C23C 16/4481; C23C 14/228
USPC ......................................................... 118/726
See application file for complete search history.

(56) References Cited

U.S. PATENT DOCUMENTS

| | | | |
|---|---|---|---|
| 6,270,839 B1* | 8/2001 | Onoe ................... | C23C 16/4481 118/726 |
| 2003/0168003 A1* | 9/2003 | Schowalter ........... | C30B 11/003 117/106 |
| 2010/0092665 A1* | 4/2010 | Sudou ..................... | C23C 14/12 427/248.1 |
| 2012/0052617 A1* | 3/2012 | Johnson .............. | C23C 14/0629 438/84 |

* cited by examiner

*Primary Examiner* — Keath Chen
(74) *Attorney, Agent, or Firm* — ScienBiziP, P.C.

(57) ABSTRACT

An evaporating device comprises a gas guiding element, an evaporating boat received in the gas guiding element to define a receiving space between the evaporation tray and the gas guiding element, and a gas channel. The evaporation tray comprises a bottom wall and two opposing first sidewalls and two opposing second sidewalls extending from the periphery of the first bottom wall. At least one of the first sidewalls and/or at least one of the second sidewalls defines a number of gas holes. The gas holes communicate with the receiving space. One end of the gas channel connects the gas guiding element and communicates with the receiving space to feed gas into the receiving space. A vacuum evaporation device using the evaporating device is also provided.

13 Claims, 8 Drawing Sheets

EVAPORATING DEVICE AND VACCUM EVAPORATION DEVICE USING THE SAME

BACKGROUND

1. Technical Field

The exemplary disclosure generally relates to an evaporating device and a vacuum evaporation device using the evaporating device.

2. Description of Related Art

Referring to FIGS. 1 and 2, a conventional vacuum evaporation device 300 is widely used to deposit coatings on a workpiece 400. The vacuum evaporation device 300 includes a coating chamber 310 and a vacuum pump 330 communicating with the coating chamber 310. The vacuum pump 330 evacuates the coating chamber 310. The vacuum evaporation device 300 further includes an evaporating device 311 and a supporting bracket 313 (schematically shown) for supporting the workpiece 400 retained in the coating chamber 310. Working gas and/or reaction gas is fed into the coating chamber 310 through a gas channel 315. The evaporating device 311 is for holding and heating evaporation material 350. The workpiece 400 includes a bottom wall 410 and a peripheral wall 430 extending from the bottom wall 410. During deposition, evaporation material 350 is evaporated and moves towards the workpiece 400 in a direction A (see FIG. 2) and reacts with the reaction gas in the coating chamber 310 to deposit a coating on the workpiece 400. Since the evaporated material 350 can only move in the direction A, the coating formed on the peripheral wall 430 is thinner than the coating formed on the bottom wall 410. As a result, the coating deposited on the workpiece 400 is non-uniform.

Therefore, there is room for improvement within the art.

BRIEF DESCRIPTION OF THE DRAWINGS

Many aspects of the housing can be better understood with reference to the following drawings. The components in the drawings are not necessarily drawn to scale, the emphasis instead being placed upon clearly illustrating the principles of the evaporating device and vacuum evaporation device. Moreover, in the drawings like reference numerals designate corresponding parts throughout the several views.

DETAILED DESCRIPTION

Figure 1:
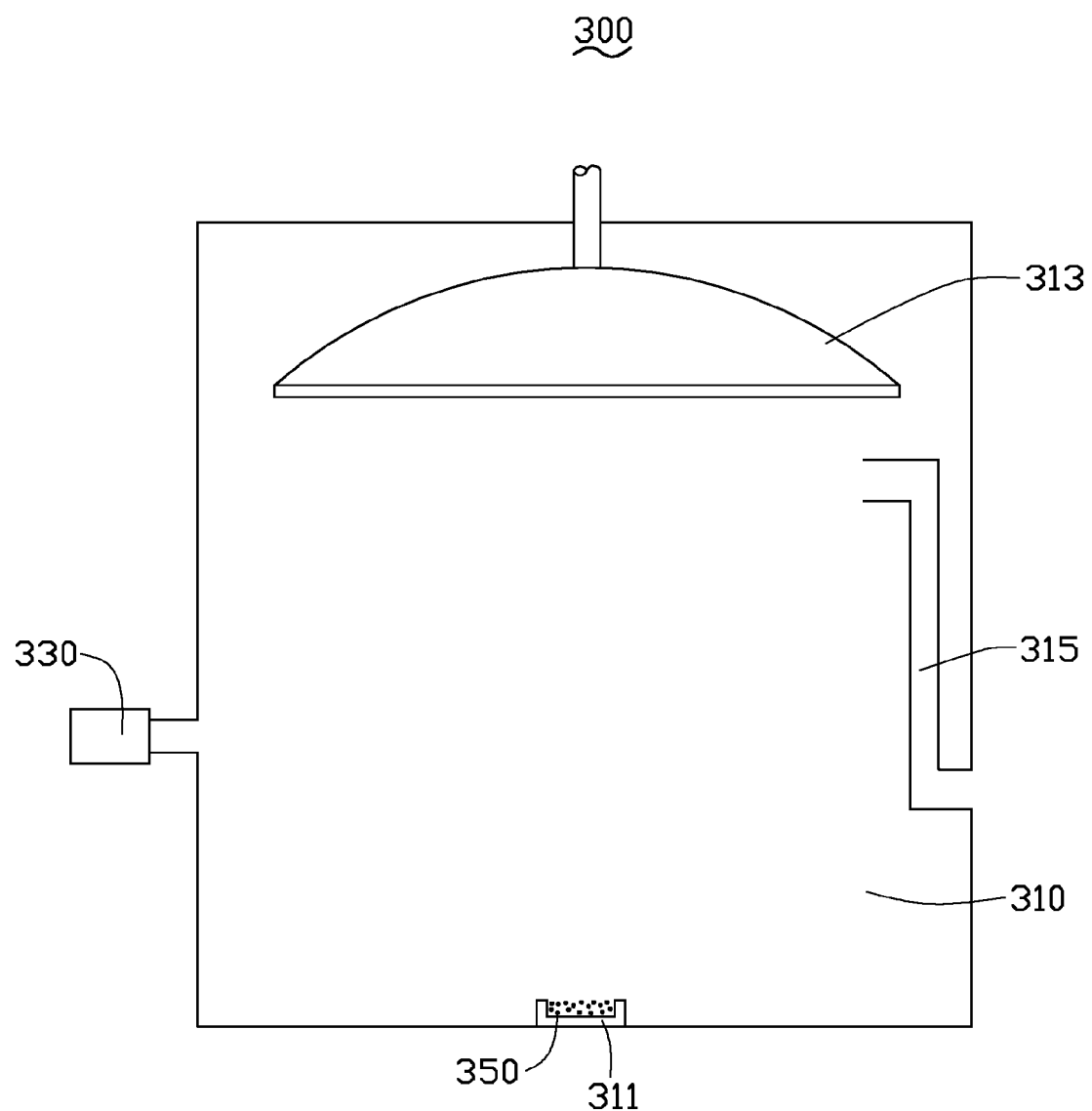
FIG. 1 is a schematic view of a prior vacuum evaporation device having an evaporating device.
Figure 2:
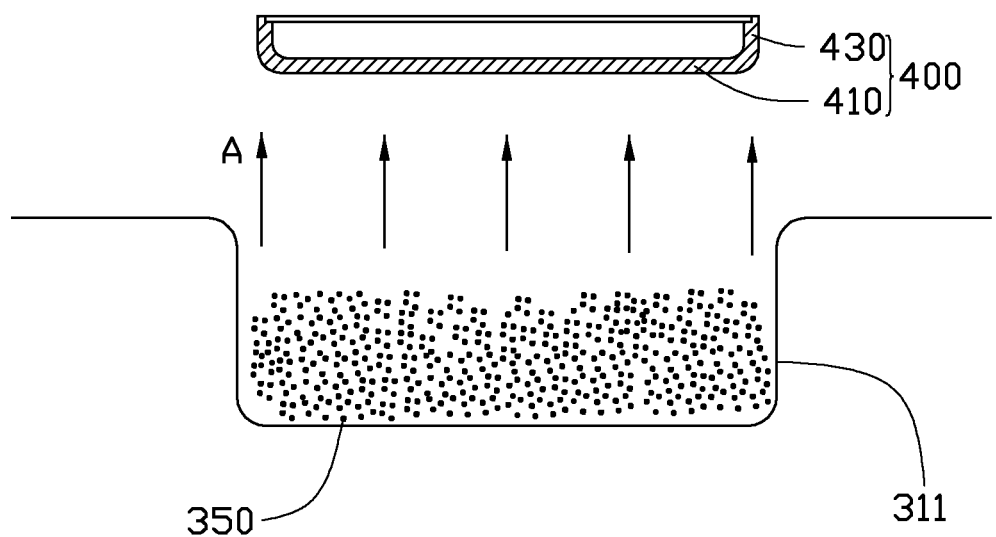
FIG. 2 is a schematic view of the movement of evaporated evaporation material retained in the evaporating device of FIG. 1.
Figure 3:
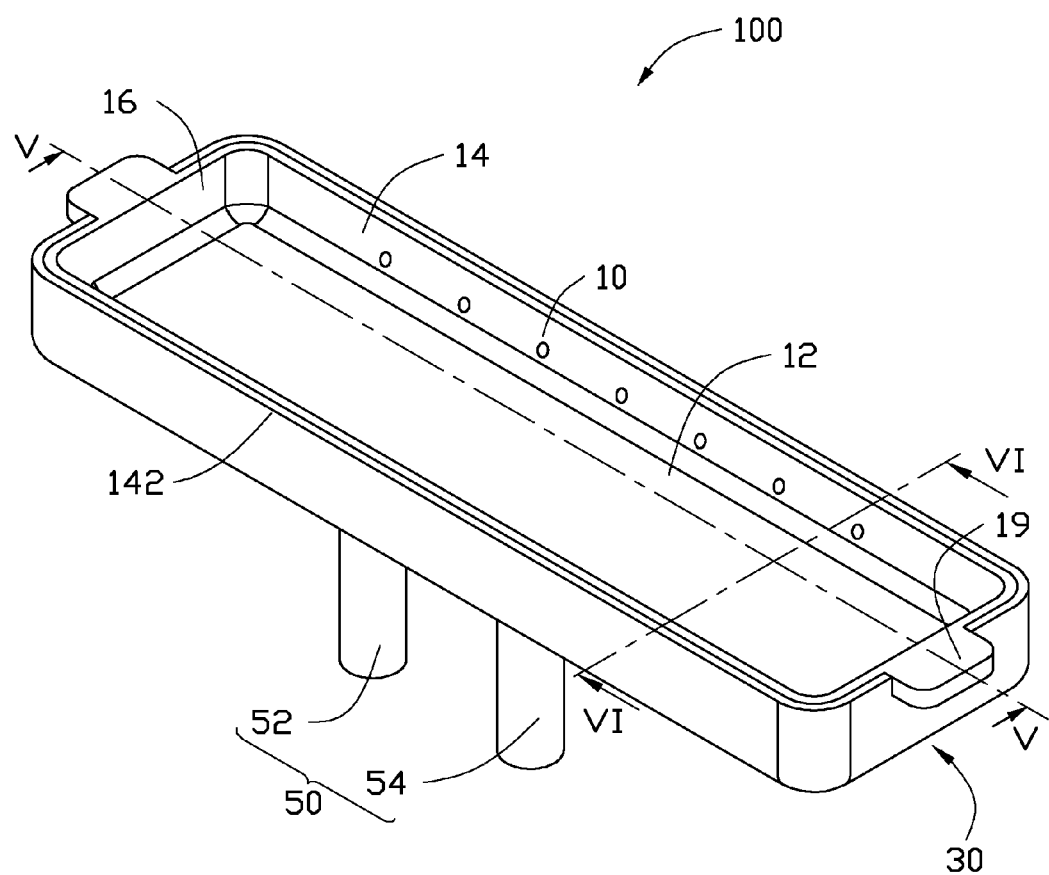
FIG. 3 is a schematic view of an exemplary embodiment of an evaporating device.
Figure 7:
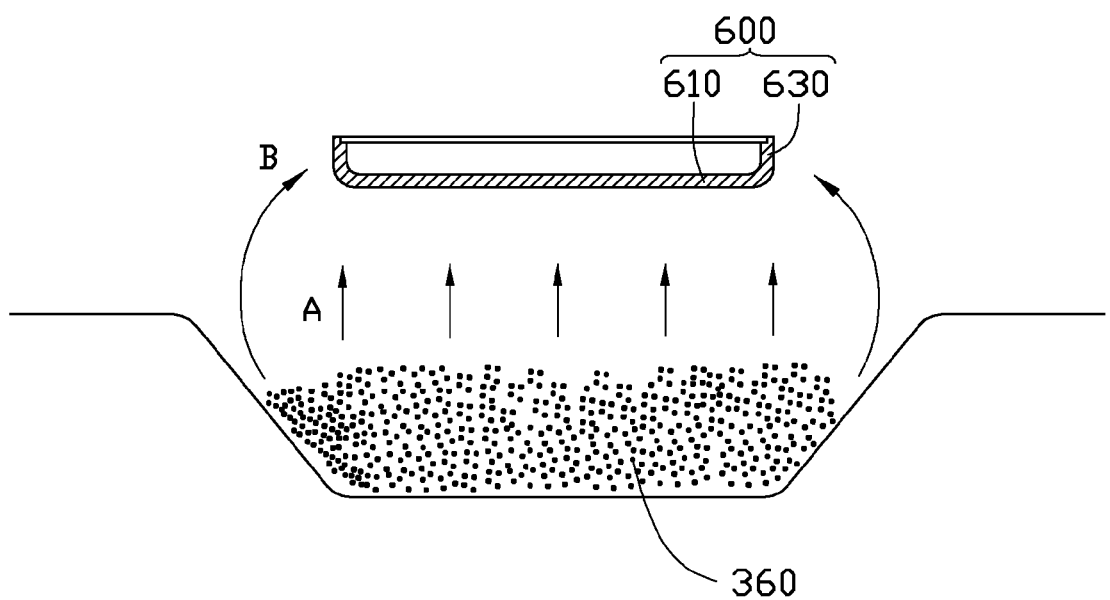
FIG. 7 is schematic view of the movement of evaporated evaporation material retained in the evaporating device of FIG. 3.
Figure 8:
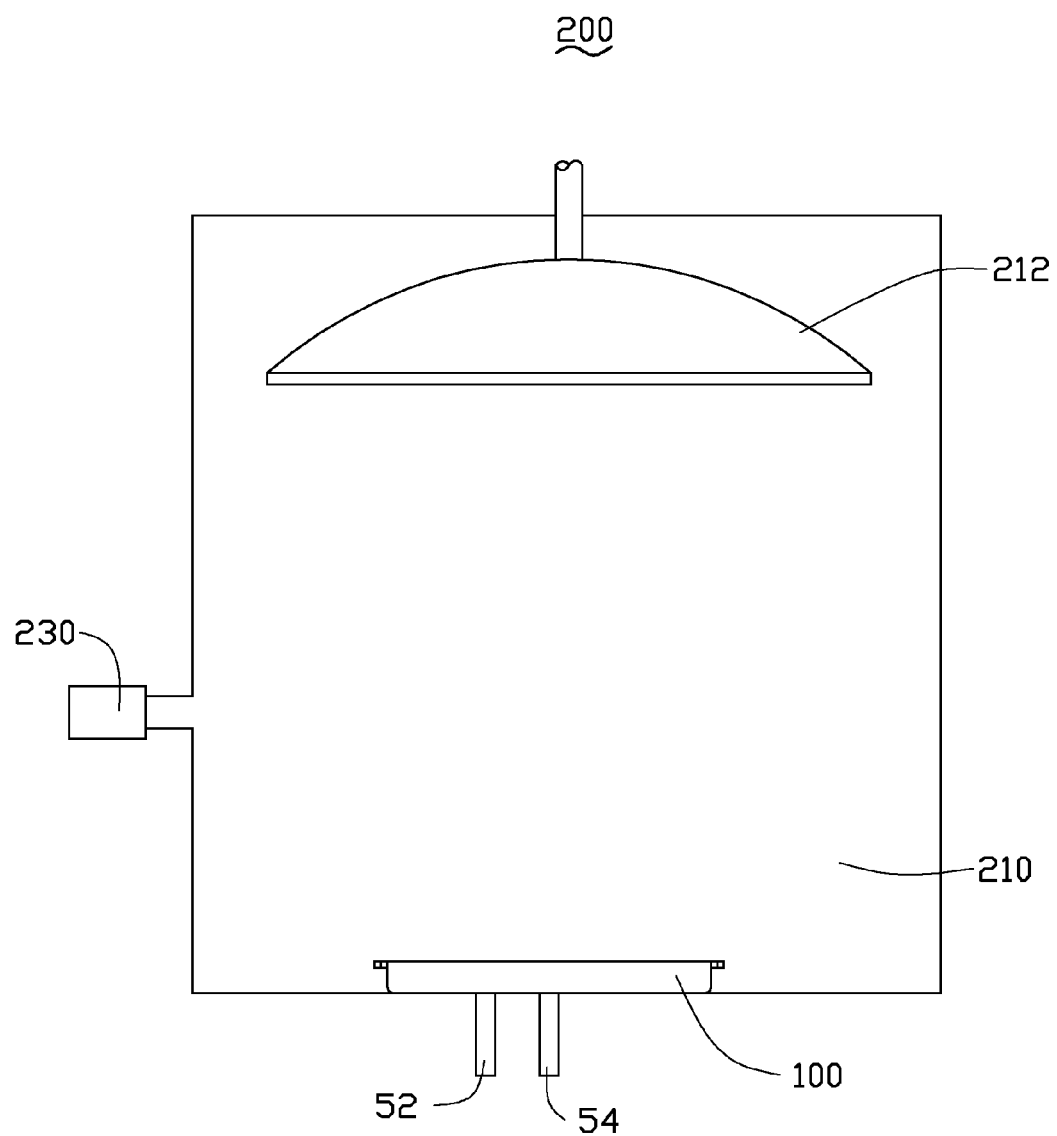
FIG. 8 is a schematic view of an exemplary embodiment of a vacuum evaporation device using the evaporating device of FIG. 3.

FIGS. 3, 7, and 8 show an exemplary evaporating device 100 used in a vacuum evaporation device 200 in place of conventional evap device 300, for depositing coating(s) on a workpiece 600. The workpiece 600 includes a bottom wall 610 and a peripheral wall 630 extending from the bottom wall 610.

Figure 4:
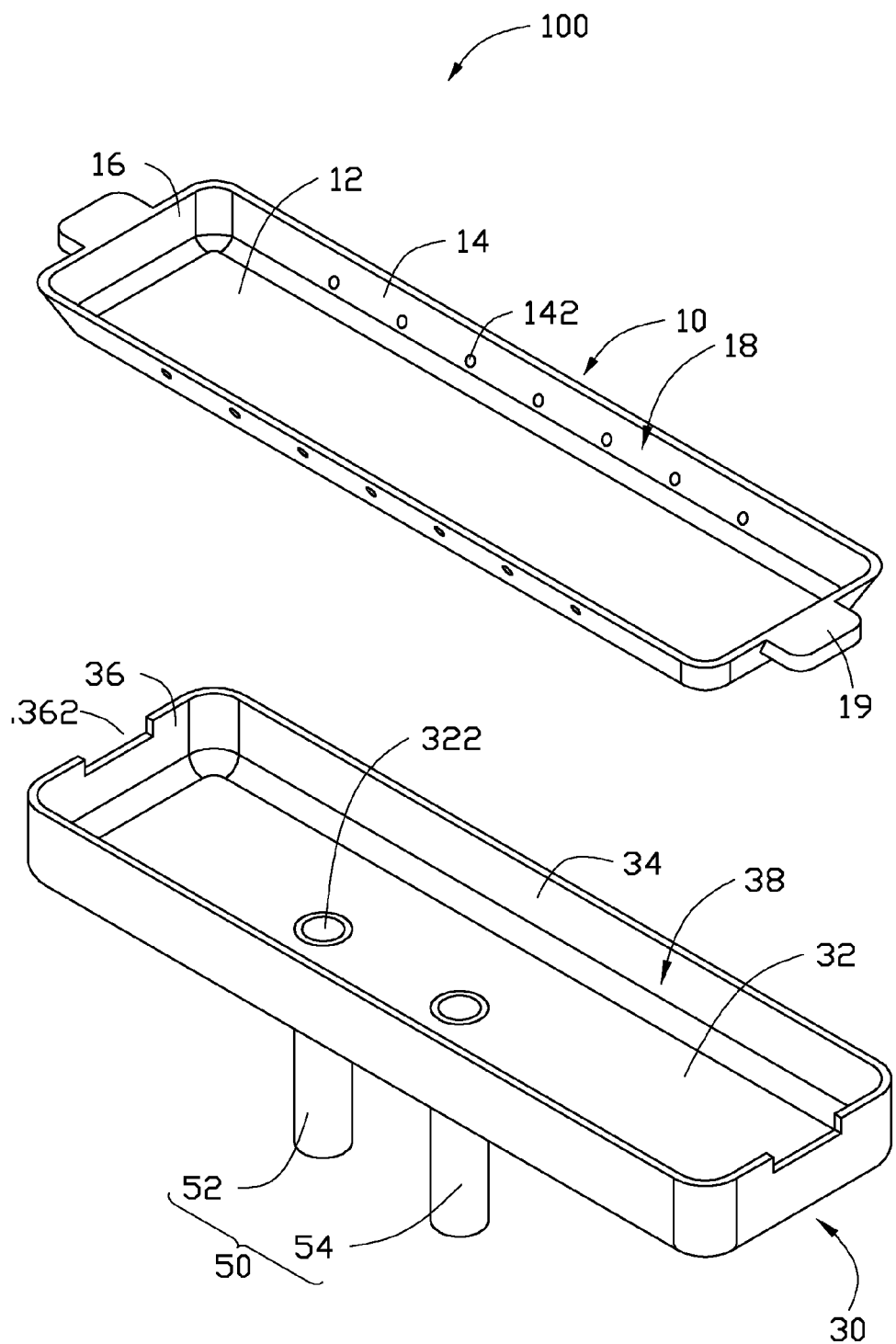
FIG. 4 is an exploded view of the evaporating device of FIG. 3.
Figure 5:
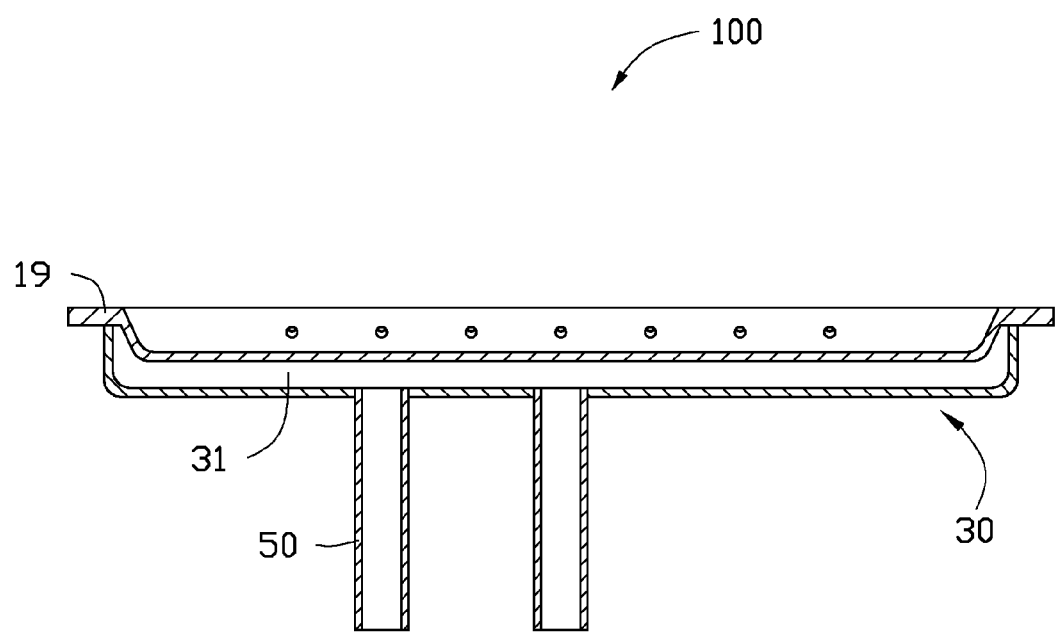
FIG. 5 is a cross-sectional view of the evaporating device of FIG. 3 taken along line V-V.

Referring to FIGS. 4 and 5, the evaporating device 100 includes an evaporation tray 10, a gas guiding element 30, and a gas channel 50. The evaporation tray 10 is received in the gas guiding element 30 to define a receiving space 31 between the evaporation tray 10 and the gas guiding element 30. One end of the gas channel 50 connects to the gas guiding element 30 to feed reaction gas and/or working gas into the receiving space 31.

The evaporation tray 10 holds and heats evaporation material 360. The evaporation material 360 may be powder or pellet(s). The evaporation tray 10 includes a substantially rectangular first bottom wall 12 and two opposite first sidewalls 14 and two opposite second sidewalls 16 extending from a periphery of the first bottom wall 12. The first bottom wall 12 and the four sidewalls cooperatively define a receiving cavity 18. The evaporation material 360 is received in the receiving cavity 18. The evaporation material 360 is high-temperature-resistant material, such as tungsten (W), copper (Cu), graphite, or mold steel.

Figure 6:
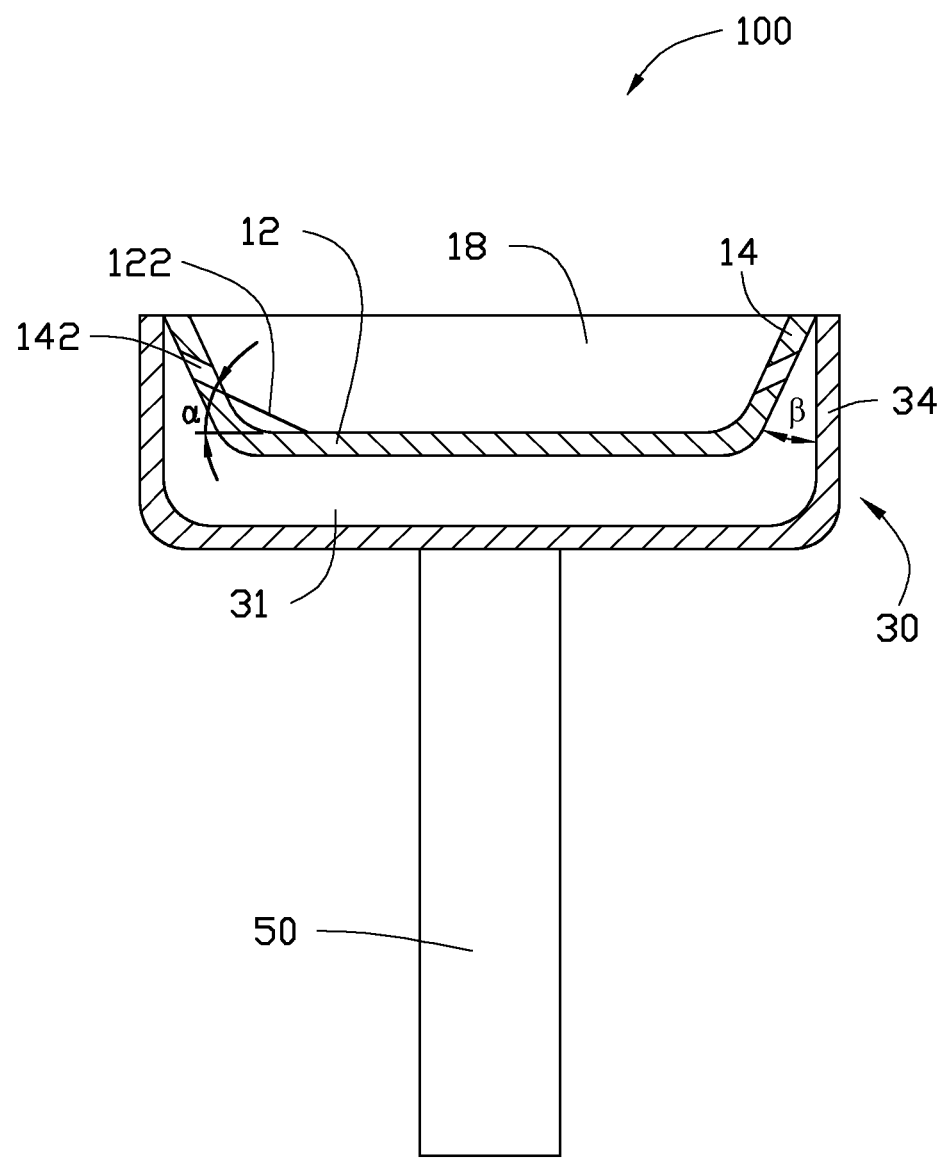
FIG. 6 is another cross-sectional view of the evaporating device of FIG. 3 taken along line VI-VI.

Each first sidewall 14 defines a plurality of gas holes 142. Referring to FIG. 6, extension lines 122 extend from the gas holes 142 towards the first bottom wall 12. Angles (α) between the extension lines 122 and the first bottom wall 12 are between 0° and 90°. The angles (α) between each extension line 122 and the first bottom wall 12 can be either identical or different to influence the directional flow of the gas.

The gas holes 142 may have any shape, for example, circular, triangular, or rectangular. When the gas holes 142 are circular, the diameters are approximately 1.5 nm to 2.5 nm. In the exemplary embodiment, the gas holes 142 are uniformly distributed in the first sidewalls 14.

In other embodiments, each second sidewall 16 also defines a plurality of gas holes 142 to enhance the flow rate of the reaction gas and working gas into the evaporation tray 10 when needed.

The evaporation tray 10 further includes two heating portions 19 extending from the periphery of the second sidewalls 16. Each heating portion 19 is connected with a heating element (not shown) to heat the evaporation material 360. In other embodiments, the two heating portions 19 also extend from the periphery of the first sidewalls 14.

Referring to FIG. 4, the gas guiding element 30 includes a substantially rectangular second bottom wall 32, two opposite third sidewalls 34, two opposite fourth sidewalls 36, and a cavity 38. The two third sidewalls 34 and the two fourth sidewalls 36 extend from the periphery of the second bottom wall 32. The cavity 38 is cooperatively defined by the second bottom wall 32, the third sidewalls 34, and the fourth sidewalls 36. The shape and opening direction of the receiving cavity 18 and the cavity 38 are substantially identical. The size of the opening of the cavity 38 is a little larger than the size of the receiving cavity 18.

The second bottom wall 32 defines at least two engaging holes 322.

Each fourth sidewall 36 defines a latching groove 362. When the evaporation tray 10 is received in the gas guiding element 30, the heating portion 19 is partly latched in the latching groove 362.

The gas channel 50 includes at least one reaction gas channel 52 and at least one working gas channel 54. The reaction gas channel 52 and the working gas channel 54 communicate with the receiving space 31 to feed reaction gas and working gas inside receiving space 31 by corresponding engaging holes 322.

Referring to FIGS. 5 and 6, when the evaporation tray 10 is received in the gas guiding element 30, an angle (β) between the third sidewall 34 and the first sidewall 14 is between 0° and 90°, and the distal end of the third sidewall 34 abuts against the free end of the first sidewall 14. The heating portion 19 is partially latched in the latching groove 362 (forming a seal), and the gas holes 142 communicate with the receiving space 31. Thus, the gas fed into the receiving space 31 can only be discharged through the gas holes 142.

The receiving space 31 provides space to retain gas before it flows into the evaporation tray 10 to prevent all the gas from flowing into the evaporation tray 10 and blowing away the evaporation material 360. Therefore, the evaporation material 360 contacts the reaction gas and the working gas uniformly.

Referring to FIG. 7, since there is an angle formed between the gas holes 142 and the first bottom wall 12, gas fed into the receiving cavity 18 through the gas holes 142 collides with and rebounds from the first bottom wall 12. In addition, gas fed into the receiving cavity 18 passes through the gas holes 142, thus reducing the mean distance between molecules of the evaporation material 360 and the gas to enhance the collision between the gas and the evaporation material 360. Both of the above change the evaporating direction and enlarge the spreading scope of the molecules of the evaporation material 360. Thus, the molecules of the evaporation material 360 can move in the directions A and B. Therefore, the thickness of the coating deposited on the peripheral wall 630 by the evaporation material 360 is increased compared to the conventional coating process.

Referring to FIG. 8, a vacuum evaporation device 200 using the evaporating device 100 is provided. The vacuum evaporation device 200 includes a coating chamber 210 and a vacuum pump 230 communicating with the coating chamber 210. The vacuum pump 230 evacuates the coating chamber 210. The vacuum evaporation device 200 further includes the evaporating device 100, a supporting bracket 212, and a heating element (not shown). The evaporating device 100 is retained in the coating chamber 210. The free ends of the reaction gas channel 52 and the working gas channel 54 are positioned outside of the coating chamber 210.

During deposition, gas is fed into the coating chamber 210 through the reaction gas channel 52 and the working gas channel 54, and the evaporation material 360 is heated and evaporated. Then, the evaporated evaporation material 360 moves in the directions A and B towards the workpiece 600 and reacts with the reaction gas in the coating chamber 210 to deposit a coating on the workpiece 600.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. An evaporation device, composing:
   a gas guiding element;
   an evaporation tray received in the gas guiding element to define a receiving space between the evaporation tray and the gas guiding element;
   the evaporation tray comprising a first bottom wall, two opposite first sidewalls and two opposite second sidewalls extending from the first bottom wall, at least one of the first sidewalls and/or at least one of the second sidewalls defining a plurality of gas holes, the gas holes communicating with the receiving space, wherein the plurality of gas holes each have an extension line that inclines towards the first bottom wall; and
   wherein the gas guiding element comprises a second bottom wall, two opposite third sidewalls, and two opposite fourth sidewalls; the two third sidewalls and the two fourth sidewalls extend from the second bottom wall, the second bottom wall, the two third sidewalls and the two fourth sidewalls cooperatively define a cavity;
   wherein the two first sidewalls each inclined toward the two third sidewalls respectively, and the distal end of the two third sidewalls abuts against the free end of the two first sidewalls, respectively;
   a gas channel, one end of the gas channel connecting to the gas guiding element and communicating with the receiving space to feed gas into the receiving space.

2. The evaporation device as claimed in claim 1, wherein the incline angles between each extension line and the first bottom wall are identical.

3. The evaporation device as claimed in claim 1, wherein the gas holes are circular, the diameters of the gas hole are about 1.5 nm to about 2.5 nm.

4. The evaporation device as claimed in claim 1, wherein the gas holes are uniformly distributed in the first sidewalls and/or the second sidewalls.

5. The evaporation device as claimed in claim 1, wherein the evaporation tray further comprises at least one heating portion extending from the periphery of one of the first sidewalls or one of the second sidewalls.

6. The evaporation device as claimed in claim 1, wherein the evaporation tray further comprises a receiving cavity cooperatively defined by the first bottom wall, the first sidewalls and the second sidewalls.

7. The evaporation device as claimed in claim 1, wherein the second bottom wall defines at least two engaging holes, the gas channel comprises at least one reaction gas channel and at least one working gas channel, the reaction gas channel and the working gas channel communicate with the receiving space to feed reaction gas and working gas inside receiving space by corresponding engaging holes.

8. A vacuum evaporation device, comprising:
   a coating chamber;
   a vacuum pump communicating with the coating chamber; and
   a evaporation device retained in the coating chamber, wherein the evaporating device comprises a gas guiding element, an evaporation tray received in the gas guiding element to define a receiving space between the evaporation tray and the gas guiding element; and a gas channel; the evaporation tray comprises a bottom wall, two opposite first sidewalls and two opposite second sidewalls extending from the first bottom wall; at least one of the first sidewalls and/or at least one of the second sidewalls defines a plurality of gas holes, the gas holes communicating with the receiving space, wherein the plurality of gas holes each have an extension line that inclines towards the bottom wall;
   wherein the gas guiding element comprises a second bottom wall, two opposite third sidewalls, and two opposite fourth sidewalls; the two third sidewalls and the two fourth sidewalls extend from the second bottom wall, the second bottom wall, the two third sidewalls and the two fourth sidewalls cooperatively define a cavity;
   wherein the two first sidewalls each inclined toward the two third sidewalls respectively, and the distal end of the two third sidewalls abuts against the free end of the two first sidewalls, respectively;

one end of the gas channel connecting to the gas guiding element and communicate the receiving space, to fed gas into the receiving space.

9. The vacuum evaporation device as claimed in claim 8, wherein the incline angles between each extension line and the first bottom wall are identical.

10. The vacuum evaporation device as claimed in claim 8, wherein the gas holes are circular, the diameters of the gas holes are about 1.5 nm to about 2.5 nm.

11. The vacuum evaporation device as claimed in claim 8, wherein the gas holes are uniformly distributed in the first sidewalls and/or the second sidewalls.

12. The vacuum evaporation device as claimed in claim 8, wherein the evaporation tray further comprises at least one heating portion extending from the periphery of one of the first sidewalls or one of the second sidewalls.

13. The vacuum evaporation device as claimed in claim 8, wherein the evaporation tray further comprises a receiving cavity defined by the first bottom wall, the first sidewalls and the second sidewalls cooperatively.

\* \* \* \* \*